(12) United States Patent
Seo et al.

(10) Patent No.: US 11,745,463 B2
(45) Date of Patent: Sep. 5, 2023

(54) MULTILAYER GRAPHITE SHEET WITH EXCELLENT ELECTROMAGNETIC SHIELDING CAPABILITY AND THERMAL CONDUCTIVITY AND MANUFACTURING METHOD THEREFOR

(71) Applicant: SKC CO., LTD., Gyeonggi-do (KR)

(72) Inventors: Jung Doo Seo, Gyeonggi-do (KR); Hoon Kim, Gyeonggi-do (KR); Jung-Gyu Kim, Gyeonggi-do (KR); Jonggab Baek, Gyeonggi-do (KR)

(73) Assignee: SKC CO., LTD., Gyeonggi-do (KR)

( * ) Notice: Subject to any disclaimer, the term of this patent is extended or adjusted under 35 U.S.C. 154(b) by 224 days.

(21) Appl. No.: 17/051,947

(22) PCT Filed: May 3, 2019

(86) PCT No.: PCT/KR2019/005323
§ 371 (c)(1),
(2) Date: Oct. 30, 2020

(87) PCT Pub. No.: WO2019/212284
PCT Pub. Date: Nov. 7, 2019

(65) Prior Publication Data
US 2021/0086474 A1    Mar. 25, 2021

(30) Foreign Application Priority Data
May 3, 2018   (KR) .......................... 10-2018-0051022

(51) Int. Cl.
*B32B 5/02*   (2006.01)
*B32B 5/24*   (2006.01)
(Continued)

(52) U.S. Cl.
CPC ................ *B32B 5/26* (2013.01); *B32B 3/263* (2013.01); *B32B 5/02* (2013.01); *B32B 5/024* (2013.01);
(Continued)

(58) Field of Classification Search
None
See application file for complete search history.

(56) References Cited

U.S. PATENT DOCUMENTS 3,174,895 A * 3/1965 Gibson ................. C04B 37/008
156/1
4,654,242 A * 3/1987 Schieber ............... C04B 35/532
428/36.1
(Continued)

FOREIGN PATENT DOCUMENTS

| CN | 102795617 A | * 11/2012 |
| CN | 103450857 A | * 12/2013 |

(Continued)

OTHER PUBLICATIONS

Machine Translation of JP-2003092384-A, Mar. 2003 (Year: 2003).*
(Continued)

*Primary Examiner* — Jeffrey A Vonch
(74) *Attorney, Agent, or Firm* — IP & T GROUP LLP

(57) ABSTRACT

An embodiment relates to a multilayer graphite sheet with excellent electromagnetic shielding capability and thermal conductivity, and a manufacturing method therefor, wherein the multilayer graphite sheet has a multilayer structure of five or more layers in total and can be manufactured to have a thick thickness of 70 μm or more such that the electromagnetic shielding capability can be significantly improved. In addition, the multilayer graphite sheet is manufactured by graphitizing a hybrid laminate in which heterogeneous materials are mixed such that thermal conductivity and electro-
(Continued)

magnetic shielding capability can be simultaneously realized at a lower cost, thereby being useful as a thick film sheet which used in various applications such as home appliances and electric vehicles.

20 Claims, 2 Drawing Sheets

(51) Int. Cl.
    *B32B 5/26*     (2006.01)
    *B32B 9/04*     (2006.01)
    *B32B 33/00*     (2006.01)
    *C01B 32/205*     (2017.01)
    *C04B 35/52*     (2006.01)
    *C04B 35/524*     (2006.01)
    *B32B 38/00*     (2006.01)
    *B32B 3/26*     (2006.01)
    *H05K 9/00*     (2006.01)
    *B32B 7/02*     (2019.01)
    *B32B 9/00*     (2006.01)
    *C01B 32/20*     (2017.01)
    *B32B 27/12*     (2006.01)
    *H05K 7/20*     (2006.01)
    *B32B 7/022*     (2019.01)
    *B32B 7/023*     (2019.01)
    *B32B 7/025*     (2019.01)

(52) U.S. Cl.
    CPC ............... *B32B 7/02* (2013.01); *B32B 9/007* (2013.01); *B32B 9/04* (2013.01); *B32B 9/047* (2013.01); *B32B 38/004* (2013.01); *C01B 32/20* (2017.08); *C01B 32/205* (2017.08); *C04B 35/522* (2013.01); *C04B 35/524* (2013.01); *H05K 9/0081* (2013.01); *H05K 9/0088* (2013.01); *B32B 5/022* (2013.01); *B32B 7/022* (2019.01); *B32B 7/023* (2019.01); *B32B 7/025* (2019.01); *B32B 38/00* (2013.01); *B32B 2038/0076* (2013.01); *B32B 2250/05* (2013.01); *B32B 2250/20* (2013.01); *B32B 2255/02* (2013.01); *B32B 2255/26* (2013.01); *B32B 2262/062* (2013.01); *B32B 2262/106* (2013.01); *B32B 2305/18* (2013.01); *B32B 2305/188* (2013.01); *B32B 2305/20* (2013.01); *B32B 2307/212* (2013.01); *B32B 2307/302* (2013.01); *B32B 2307/72* (2013.01); *B32B 2307/732* (2013.01); *B32B 2309/105* (2013.01); *B32B 2313/04* (2013.01); *B32B 2509/00* (2013.01); *B32B 2605/00* (2013.01); *H05K 7/2039* (2013.01); *H05K 7/20481* (2013.01); *Y10T 428/2495* (2015.01); *Y10T 428/24355* (2015.01); *Y10T 428/24942* (2015.01); *Y10T 428/24967* (2015.01); *Y10T 428/24975* (2015.01); *Y10T 428/24992* (2015.01); *Y10T 442/3854* (2015.04)

(56) References Cited

U.S. PATENT DOCUMENTS

| | | | | |
|---|---|---|---|---|
| 4,777,083 | A * | 10/1988 | Ono | C04B 37/008 428/218 |
| 5,103,504 | A * | 4/1992 | Dordevic | A41D 13/008 2/457 |
| 2004/0076810 | A1* | 4/2004 | Blain | B32B 9/00 264/29.7 |
| 2006/0220320 | A1* | 10/2006 | Potier | B32B 18/00 277/308 |
| 2007/0110661 | A1* | 5/2007 | Hirose | H05K 7/2039 423/448 |
| 2011/0045300 | A1* | 2/2011 | Tamaoki | C01B 32/21 156/60 |
| 2012/0219778 | A1* | 8/2012 | Kapaun | D04H 1/4374 156/60 |
| 2013/0213630 | A1* | 8/2013 | Southard, II | F28F 21/02 165/185 |
| 2014/0332993 | A1* | 11/2014 | Ooshiro | C01B 32/21 423/448 |
| 2015/0266739 | A1* | 9/2015 | Zhamu | C01B 32/182 428/408 |
| 2016/0016378 | A1* | 1/2016 | Oikawa | H01L 23/373 361/679.55 |
| 2017/0089650 | A1* | 3/2017 | Wu | H01L 23/367 |
| 2017/0355603 | A1* | 12/2017 | Tachibana | C01B 32/20 |
| 2018/0362823 | A1* | 12/2018 | Liu | B32B 15/08 |
| 2018/0371608 | A1* | 12/2018 | Moriguchi | C23C 14/541 |
| 2019/0039908 | A1* | 2/2019 | Tachibana | C01B 32/205 |
| 2019/0270645 | A1 | 9/2019 | Seo et al. | |

FOREIGN PATENT DOCUMENTS

| | | | | |
|---|---|---|---|---|
| CN | 103922324 | A * | 7/2014 | |
| CN | 104310379 | A * | 1/2015 | |
| CN | 104445174 | A * | 3/2015 | |
| CN | 104883858 | A * | 9/2015 | |
| CN | 105113088 | A * | 12/2015 | |
| DE | 3307090 | A * | 9/1984 | ............ B32B 18/00 |
| DE | 102016219214 | A1 * | 4/2018 | |
| EP | 175878 | A * | 4/1986 | ............ B32B 18/00 |
| EP | 231787 | A * | 8/1987 | ............ B32B 18/00 |
| EP | 237031 | A * | 9/1987 | ............ C04B 35/83 |
| EP | 433478 | A * | 6/1991 | ............ B32B 18/00 |
| EP | 449312 | A * | 10/1991 | ........... C04B 35/524 |
| GB | 2263904 | A * | 8/1993 | ............ C04B 35/83 |
| JP | 56157478 | A * | 12/1981 | |
| JP | 60-181129 | A | 9/1985 | |
| JP | 61-275116 | A | 12/1986 | |
| JP | 02065299 | A * | 3/1990 | |
| JP | 05301781 | A * | 11/1993 | |
| JP | 06100367 | A * | 4/1994 | |
| JP | 7-109171 | A | 4/1995 | |
| JP | 10045474 | A * | 2/1998 | ........... C04B 35/522 |
| JP | 11017387 | A * | 1/1999 | |
| JP | 2000178016 | A * | 6/2000 | |
| JP | 2003-092384 | A | 3/2003 | |
| JP | 2003092384 | A * | 3/2003 | |
| JP | 2008069061 | A * | 3/2008 | ............ H01G 11/34 |
| JP | 2008120680 | A * | 5/2008 | ........... C04B 35/536 |
| JP | 2009190962 | A * | 8/2009 | |
| JP | 2010001191 | A * | 1/2010 | |
| JP | 2010064391 | A * | 3/2010 | |
| JP | 2010064949 | A * | 3/2010 | ............ C01B 32/20 |
| JP | 2010070412 | A * | 4/2010 | |
| JP | 2010070413 | A * | 4/2010 | |
| JP | 2012076958 | A * | 4/2012 | |
| JP | 2014-083786 | A | 5/2014 | |
| JP | 2015174807 | A * | 10/2015 | |
| JP | 2016-028880 | A | 3/2016 | |
| JP | 2016153356 | A * | 8/2016 | |
| JP | 2017071079 | A * | 4/2017 | |
| JP | 6303046 | B2 | 3/2018 | |
| KR | 2017010604 | A * | 2/2017 | ............ B32B 27/08 |
| KR | 2017011501 | A * | 2/2017 | ............ B32B 27/12 |
| KR | 2017072740 | A * | 6/2017 | ............ C01B 31/04 |
| RU | 2234176-02 | | 8/2004 | |
| RU | 95592 | U1 * | 7/2010 | |
| RU | 2427530 | C1 * | 8/2011 | |
| WO | WO-9910598 | A1 * | 3/1999 | ............ D21H 13/26 |
| WO | WO-0106169 | A1 * | 1/2001 | ............ B32B 18/00 |
| WO | WO-0142338 | A2 * | 6/2001 | ............ B32B 18/00 |
| WO | WO-2009060818 | A1 * | 5/2009 | ............ C01B 32/20 |
| WO | 2015-155940 | A1 | 10/2015 | |

(56) References Cited

FOREIGN PATENT DOCUMENTS

| WO | WO-2016175453 A1 | * | 11/2016 | ............ | B32B 19/04 |
| WO | WO-2017207068 A1 | * | 12/2017 | ............ | B32B 18/00 |
| WO | 2018/074889 A2 | | 4/2018 | | |

OTHER PUBLICATIONS

Machine Translation of CN-105113088-A, Dec. 2015 (Year: 2015).*
Office Action for application 201980044044.5 issued by the Chinese intellectual Property Office dated May 20, 2022.

* cited by examiner

[Fig. 1]
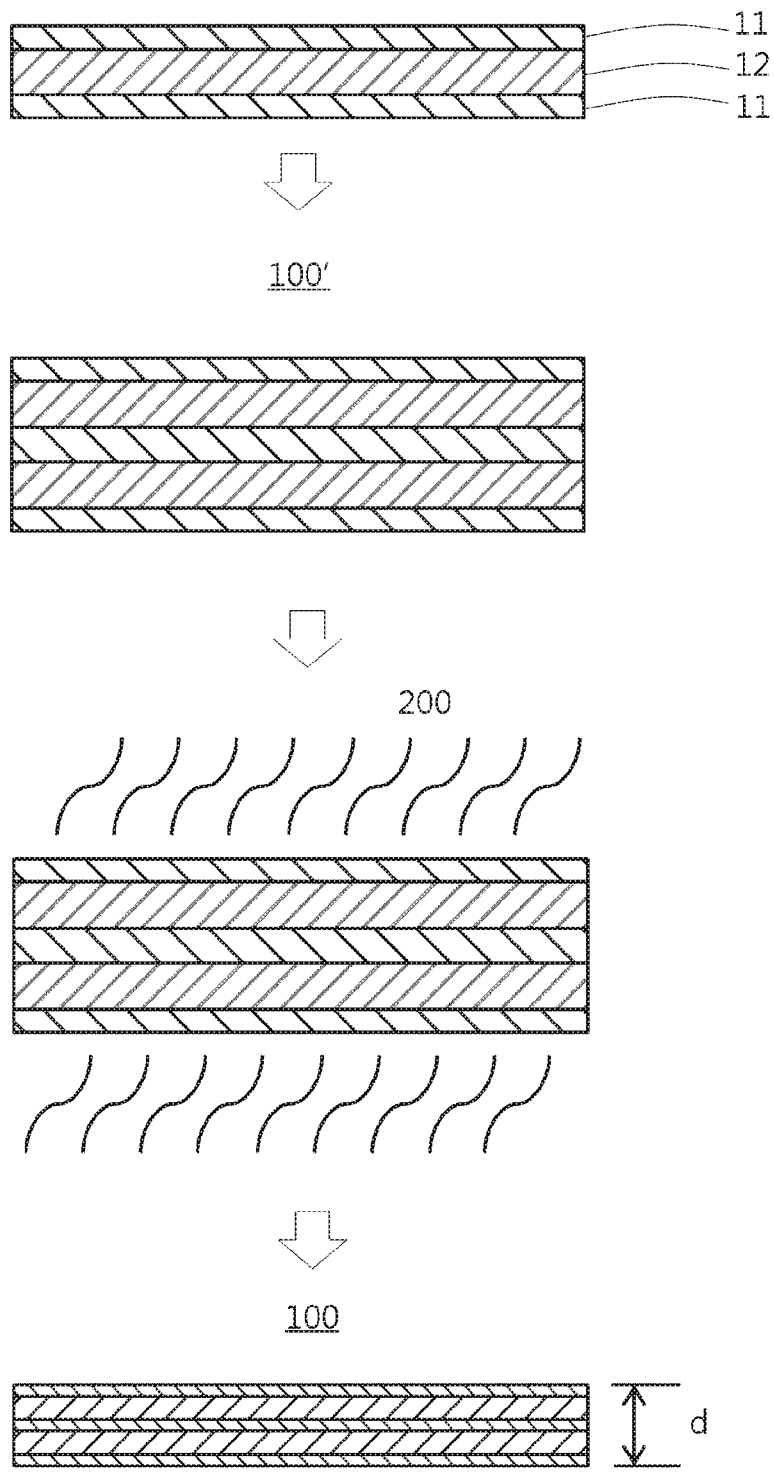

[Fig. 2]
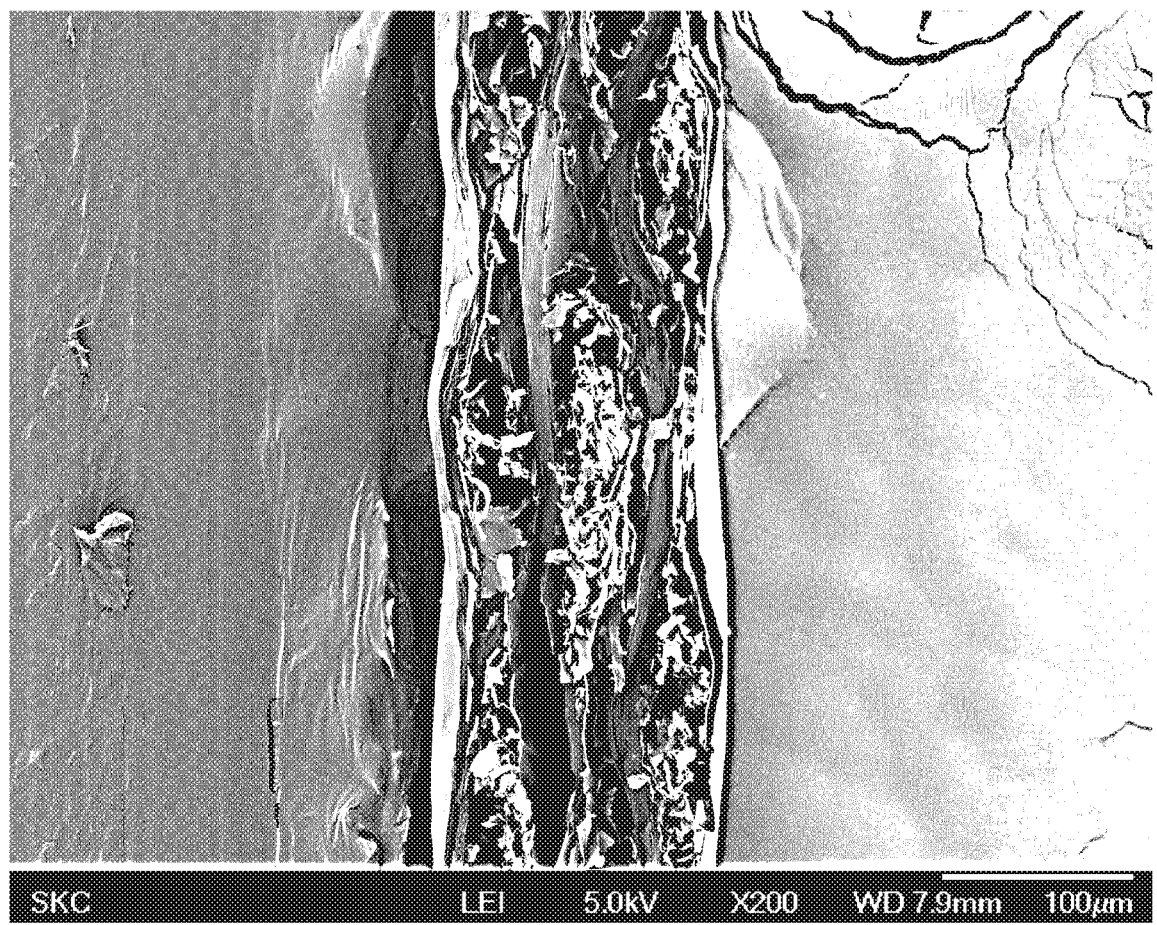
[Fig. 3]
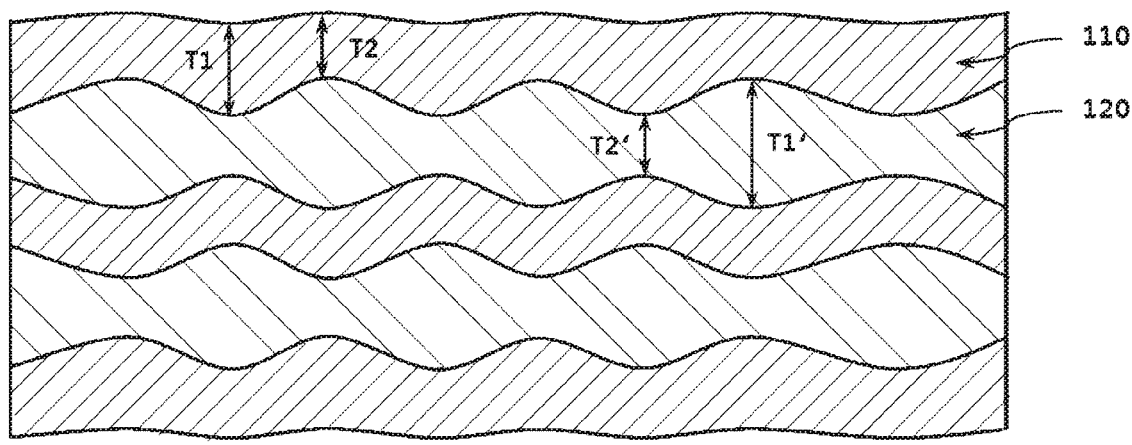

MULTILAYER GRAPHITE SHEET WITH EXCELLENT ELECTROMAGNETIC SHIELDING CAPABILITY AND THERMAL CONDUCTIVITY AND MANUFACTURING METHOD THEREFOR

This application is a national stage application of PCT/KR2019/005323 filed on May 3, 2019, which claims priorities of Korean patent application number 10-2018-0051022 filed on May 3, 2018. The disclosure of each of the foregoing applications is incorporated herein by reference in its entirety.

TECHNICAL FIELD

Embodiments relate to a multilayer graphite sheet with excellent electromagnetic shielding capability and thermal conductivity and a process for preparing the same.

BACKGROUND ART

Graphite sheets may be prepared by a graphite expansion method using natural graphite. Specifically, in the graphite expansion method, natural graphite is immersed in a mixture of concentrated sulfuric acid and acetic acid, which is rapidly heated, the acids are removed by a series of a washing process, and it is formed into a film shape using a high-pressure press. However, the graphite sheet prepared by this method has disadvantageous in that it is weak in strength and poor in heat dissipation characteristics in terms of thermal conductivity. It also has a disadvantage in that defects may be caused by the residual acid employed in the washing process.

In order to deal with the above problems, a polymer graphitization method has been developed in which a polymer film is thermally treated to be carbonized and graphitized to prepare a graphite sheet. The polymer film used in this method includes, for example, polyoxadiazole, polyimide, polyphenylenevinylene, polybenzoimidazole, polybenzoxazole, polythiazole, and polyamide films.

The polymer graphitization method is very simple as compared with the conventional graphite expansion method. It also has an advantage in that the incorporation of impurities such as acids is not involved in the process. In addition, the graphite sheet prepared by the polymer graphitization method is excellent in thermal conductivity and electric conductivity, which are close to those of single-crystalline graphite (see Japanese Laid-open Patent Publication Nos. Sho 60-181129, Hei 7-109171, and Sho 61-275116).

Meanwhile, in recent years, there is a demand for a sheet that can be mounted on mobile devices such as mobile phones, tablet PCs, and laptop PCs to exhibit not only a heat dissipation function but also an electromagnetic shielding function.

DISCLOSURE OF INVENTION

Technical Problem

Despite various advantages of the conventional polymer graphitization method, it has problems in that a polymer film such as a polyimide film as a raw material is generally expensive and that it is difficult to prepare a thick graphite sheet of 70 μm or more due to the limitations to materials. However, the electromagnetic shielding capability of a graphite sheet having a thickness of less than 70 μm is not well implemented. Thus, it has been difficult to simultaneously achieve high thermal conductivity and electromagnetic shielding capability with the conventional method.

Accordingly, the embodiments aim to provide a multilayer graphite sheet with excellent electromagnetic shielding capability and thermal conductivity by mixing relatively inexpensive materials to obtain a hybrid-type laminate and carbonizing and graphitizing it, and a process for preparing the same.

Solution to Problem

According to an embodiment, there is provided a multilayer graphite sheet, which comprises a laminate in which at least one first graphite layer and at least one second graphite layer are alternately laminated in a total of five layers or more, wherein the first graphite layer is denser than the second graphite layer.

In addition, according to an embodiment, there is provided a process for preparing a multilayer graphite sheet, which comprises coating a resin composition on one or both sides of a fibrous substrate to form a coating layer; preparing a laminate in which at least one of the fibrous substrate and at least one of the coating layer are alternately laminated in a total of 5 layers or more; thermally treating the laminate to cure the coating layer as a first thermal treatment; and further thermally treating the laminate subjected to the first thermal treatment to carbonize and graphitize the fibrous substrate and the coating layer as a second thermal treatment.

Advantageous Effects of Invention

Since the multilayer graphite sheet of the above embodiment has a multilayer structure in a total of 5 layers or more, it can be prepared to a thickness of 70 μm or more even after rolling, so that the electromagnetic shielding capability can be remarkably enhanced.

In addition, the multilayer graphite sheet can have excellent thermal conductivity by increasing its density through rolling and further strengthening the layered structure.

In particular, the multilayer graphite sheet is prepared by graphitizing a hybrid laminate in which different materials are used. Thus, it is possible to simultaneously achieve thermal conductivity and electromagnetic shielding capability at a lower cost.

Thus, the multilayer graphite sheet is useful as a thick sheet that can be used in various applications such as home appliances and electric vehicles.

BRIEF DESCRIPTION OF DRAWINGS

FIG. 1 illustrates a process for preparing a multilayer graphite sheet (in a total of 5 layers) according to an embodiment.

FIG. 2 is a scanning electron microscope (SEM) image of a cross-section of a multilayer graphite sheet (in a total of 7 layers) according to an embodiment.

FIG. 3 schematically illustrates a cross-section of a multilayer graphite sheet (in a total of 5 layers) according to an embodiment.

REFERENCE NUMERALS OF THE DRAWINGS

11: coating layer
12: fibrous substrate
100': laminate (before carbonization and graphitization)

| | |
|---|---|
| 100: multilayer graphite sheet | 200: thermal treatment |
| T1, T1': maximum thickness | T2, T2': minimum thickness |
| d: thickness of a multilayer graphite sheet | |

BEST MODE FOR CARRYING OUT THE INVENTION

Hereinafter, the present embodiments will be described in detail.

According to an embodiment, there is provided a multilayer graphite sheet, which comprises a laminate in which at least one first graphite layer and at least one second graphite layer are alternately laminated in a total of five layers or more, wherein the first graphite layer is denser than the second graphite layer.

The multilayer graphite sheet comprises a laminate in which the first graphite layer and the second graphite layer are alternately laminated.

The first graphite layer is relatively denser than the second graphite layer.

That is, the components in the first graphite layer may exist in closer contact with each other than the components in the second graphite layer.

Thus, the first graphite layer may have a density higher than that of the second graphite layer. For example, the density of the first graphite layer may be 1.1 times or more, 1.5 times or more, or 2 times or more of the density of the second graphite layer. Specifically, the density of the first graphite layer may be 1.1 to 10 times, 1.1 to 5 times, 1.1 to 3 times, or 1.1 to 2 times, the density of the second graphite layer.

The total number of layers of the laminate may be 5 or more, for example, 8 or more, or 10 or more. Specifically, the total number of layers of the laminate may be 5 to 30, 5 to 20, 5 to 15, 5 to 11, or 10 to 20.

In one embodiment, the multilayer graphite sheet may be a rolled sheet.

That is, the multilayer graphite sheet may be obtained through rolling in the preparation process. Accordingly, the multilayer graphite sheet may have a higher density, and the thermal conductivity in the horizontal direction may be enhanced by virtue of such a high density and layered structure.

In addition, referring to FIG. 1, the multilayer graphite sheet (100) may have a thickness (d) of at least a certain level even upon rolling by virtue of the multilayer structure.

For example, the multilayer graphite sheet may have a total thickness of 70 µm or more. Further, the total thickness of the multilayer graphite sheet may be 100 µm or more, 120 µm or more, or 150 µm or more. Specifically, the total thickness of the multilayer graphite sheet may be 70 µm to 1,000 µm, for example, 100 µm to 1,000 µm, for example, 100 µm to 600 µm, for example, 100 µm to 400 µm, for example, 100 µm to 250 µm, for example, 100 µm to 200 µm.

Meanwhile, it has been difficult that a synthetic graphite sheet prepared by carbonizing and graphitizing a conventional polyimide-based film or the like has a thickness of 70 µm or more due to the characteristics of the material. On the other hand, since the multilayer graphite sheet may have a larger thickness than the conventional one, it may have advantages in that the electromagnetic shielding capability is remarkably enhanced and that the heat capacity is increased.

In another embodiment, the multilayer graphite sheet may be an unrolled sheet. In such case, the multilayer graphite sheet may have a larger thickness.

For example, the total thickness of the multilayer graphite sheet may be 200 µm or more or 300 µm or more. Specifically, the total thickness of the multilayer graphite sheet may be 200 µm to 1,000 µm, for example, 250 µm to 600 µm, for example, 300 µm to 450 µm.

The multilayer graphite sheet may have an electromagnetic shielding capability of 100 dB or more, for example, 110 dB or more, for example, 130 dB or more, in the range of 30 MHz to 1,500 MHz.

Specifically, the multilayer graphite sheet may have an electromagnetic shielding capability of 100 dB to 200 dB, for example, 110 dB to 200 dB, for example, 130 dB to 200 dB, for example, 100 dB to 150 dB, for example, 110 dB to 150 dB, for example, 130 dB to 150 dB, in the range of 30 MHz to 1,500 MHz.

The multilayer graphite sheet may have a thermal conductivity of 600 W/m·K or more, for example, 700 W/m·K or more, for example, 700 W/m·K to 1,300 W/m·K, for example, 850 W/m·K to 1,100 W/m·K, in the horizontal direction.

In addition, the multilayer graphite sheet may have a thermal conductivity of 1 W/m·K or more, for example, 5 W/m·K or more, for example, 5 W/m·K to 10 W/m·K, in the vertical direction.

In one embodiment, the multilayer graphite sheet may simultaneously have an electromagnetic shielding capability of 110 dB or more in the range of 30 MHz to 1,500 MHz and a thermal conductivity of 700 W/m·K to 1,300 W/m·K in the horizontal direction.

In addition, the multilayer graphite sheet may have a density of 1.3 g/cm$^3$ to 1.8 g/cm$^3$, for example, 1.5 g/cm$^3$ to 1.8 g/cm$^3$. The above density may be an apparent density. Here, the apparent density may be calculated as a value obtained by dividing the weight of the multilayer graphite sheet by the volume thereof. That is, the multilayer graphite sheet comprises a first graphite layer and a second graphite layer, which have different densities from each other, and has an apparent density within the above range by virtue of the entire multilayer structure comprising them. Since it has an apparent density within the above range by virtue of the entire multilayer structure comprising the first graphite layer and the second graphite layer, the multilayer graphite sheet can produce excellent effects in terms of thermal conductivity and heat capacity.

The laminate may have the first graphite layer as the surface layers on both sides.

That is, the surface layers on both sides of the laminate may be the first graphite layer, and the second graphite layer and the first graphite layer may be alternately laminated as the inner layers. Thus, the number of the first graphite layers in the laminate may be one more than the number of the second graphite layers.

For example, the laminate may comprise 3 to 6 layers of the first graphite layer and 2 to 5 layers of the second graphite layer.

Specifically, the laminate may have a five-layer structure of the first graphite layer/second graphite layer/first graphite layer/second graphite layer/first graphite layer. Alternatively, it may have a laminated structure of more than five layers of the first graphite layer/second graphite layer/ . . . /second graphite layer/first graphite layer.

The first graphite layer may have a thickness of 10 µm to 50 µm, and the second graphite layer may have a thickness of 5 µm to 60 µm. Specifically, the first graphite layer may have a thickness of 15 μm to 45 μm, and the second graphite layer may have a thickness of 20 μm to 50 μm.

The second graphite layer may have a thickness variation greater than that of the first graphite layer. Here, the thickness variation may refer to a difference between the maximum thickness and the minimum thickness when the thicknesses at multiple points of a layer are measured. For example, referring to FIG. 3, the thickness variation of the first graphite layer may be calculated as the difference (T1−T2) between the maximum thickness (T1) and the minimum thickness (T2) when the thicknesses at multiple points of the first graphite layer (110) are measured. In addition, the thickness variation of the second graphite layer may be calculated as the difference (T1'−T2') between the maximum thickness (T1') and the minimum thickness (T2') when the thicknesses at multiple points of the second graphite layer (120) are measured.

As an example, the first graphite layer may have a thickness variation of less than 40 μm, and the second graphite layer may have a thickness variation of 40 μm or more. Specifically, the first graphite layer may have a thickness variation of 5 μm to 20 μm, and the second graphite layer may have a thickness variation of 40 μm to 60 μm.

In addition, the interface between the first graphite layer and the second graphite layer in a cross-section in the thickness direction of the multilayer graphite sheet may have a curved shape. For example, the interface between the first graphite layer and the second graphite layer may have a curved shape such as a wavy pattern.

FIG. 2 is a scanning electron microscope (SEM) image of a cross-section of a multilayer graphite sheet according to an embodiment.

Specifically, the multilayer graphite sheet shown in FIG. 2 has a seven-layer structure (i.e., first graphite layer/second graphite layer/first graphite layer/second graphite layer/first graphite layer/second graphite layer/first graphite layer), and it can be seen that the interface between the first graphite layer and the second graphite layer has a curved shape of a wavy pattern. In addition, it can be seen that the thickness variation of the second graphite layer is large, while the thickness of the first graphite layer is almost constant.

The first graphite layer and the second graphite layer may comprise different graphitized materials.

As an example, the first graphite layer may comprise a graphitized material of a cured resin, and the second graphite layer may comprise a graphitized material of a fibrous substrate.

The cured resin is not particularly limited as long as it is a cured material of a curable polymer resin. For example, the cured resin is a cured material of a resin selected from the group consisting of polyamic acid, polyvinyl chloride, polyester, polyurethane, polyethylene, polyfluoroethylene, polyvinyl alcohol, acrylic, and polypropylene, or a cured material of a composition comprising the resin.

As a preferred example, the cured resin may comprise a cured material of a composition comprising polyamic acid. In such event, the cured material of the composition comprising polyamic acid may be a polyimide composition.

The fibrous substrate is not particularly limited as long as it is a substrate comprising fibers or fibrous materials. For example, the fibrous substrate may comprise a woven fabric, a non-woven fabric, or paper.

In addition, the fibrous substrate may comprise natural fibers or synthetic fibers. Specifically, the fibrous substrate may be a woven fabric, a non-woven fabric, or paper that comprises at least one fiber selected from the group consisting of natural fibers including cotton, hemp, wool, and silk; cellulose-based fibers including rayon, acetate, and triacetate; and synthetic fibers including nylon, polyester, polyurethane, polyethylene, polyvinyl chloride, polyfluoroethylene, polyvinyl alcohol, acrylic, and polypropylene.

As a specific example, the multilayer graphite sheet may be obtained by subjecting a laminate, in which a total of five or more layers of the fibrous substrate and the coating layer made of polyamic acid (i.e., polyimide precursor) are alternately laminated, to curing, carbonization, and graphitization through thermal treatment.

FIG. 1 illustrates a process for preparing a multilayer graphite sheet according to an embodiment.

According to an embodiment, referring to FIG. 1, there is provided a process for preparing a multilayer graphite sheet (100), which comprises coating a resin composition on one or both sides of a fibrous substrate (12) to form a coating layer (11); preparing a laminate (100') in which at least one of the fibrous substrate (12) and at least one of the coating layer (11) are alternately laminated in a total of 5 layers or more; thermally treating (200) the laminate to cure the coating layer as a first thermal treatment; and further thermally treating the laminate subjected to the first thermal treatment to carbonize and graphitize the fibrous substrate and the coating layer as a second thermal treatment.

First, a resin composition is coated on one or both sides of a fibrous substrate.

The specific type of the fibrous substrate used here is as exemplified above.

In addition, the resin composition may be a liquid resin composition. For example, it may contain a polymer resin, a solvent, a catalyst, and a dehydrating agent. In such event, the content of the polymer resin in the resin composition may be 1% by weight to 85% by weight, for example, 5% by weight to 50% by weight, for example, 10% by weight to 30% by weight. In addition, the content of the catalyst in the resin composition may be 1% by weight to 5% by weight, and the content of the dehydrating agent may be 10% by weight to 20% by weight.

The polymer resin is a curable polymer resin, and its specific type is as exemplified above. For example, the polymer resin may be polyamic acid. Thus, the resin composition may comprise polyamic acid, a solvent, a catalyst, and a dehydrating agent.

The polyamic acid may have a weight average molecular weight of 100,000 to 400,000 g/mole or 200,000 to 300,000 g/mole.

The coating method is not particularly limited as long as it is a conventional method for forming a coating layer.

For example, it may be coated by a method such as die coating, gravure coating, micro gravure coating, comma coating, roll coating, dip coating, spray coating, bar coating, and dip coating to form a layered structure.

The coating may be carried out once or repeated a plurality of times to form a coating layer having an appropriate thickness. For example, it may be formed to a thickness of 5 μm to 60 μm, or 20 μm to 50 μm, based on one layer of the polyamic acid coating layer.

Next, a laminate in which at least one of the fibrous substrate and at least one of the coating layer are alternately laminated in a total of 5 layers or more is prepared.

For example, two or more of the fibrous substrates coated in the previous step may be laminated to prepare a laminate. Specifically, in the case where two coated fibrous substrates are laminated, a five-layer laminate can be prepared in the order of coating layer/substrate/coating layer/substrate/coating layer.

In such event, the number of laminated layers may be adjusted more or less as necessary, and multilayer sheets having various thicknesses may be prepared depending on the number of laminated layers.

Meanwhile, the alternate lamination is to be carried out such that the coating layer is at the outermost. Accordingly, both surface layers of the laminate may be formed of the coating layer.

The total thickness of the laminate may be 200 μm or more or 300 μm or more. Specifically, the total thickness of the laminate may be 200 μm to 1,000 μm, for example, 250 μm to 600 μm, for example, 300 μm to 450 μm. Within the above range, a multilayer graphite sheet having an appropriate thickness can be obtained upon the subsequent thermal treatment step and other processing steps such as rolling.

Thereafter, the laminate is thermally treated to cure the coating layer in the first thermal treatment. The thermal treatment conditions in this step are not particularly limited as long as they are process conditions that can be adopted to cure a conventional curable polymer. Specifically, the thermal treatment may be carried out under process conditions for imidizing polyamic acid.

For example, the first thermal treatment may comprise a first-first thermal treatment carried out at 100° C. to 150° C. for 10 minutes to 15 minutes; a first-second thermal treatment carried out at 230° C. to 250° C. for 5 minutes to 7 minutes; and a first-third thermal treatment carried out at 400° C. to 420° C. for 5 minutes to 7 minutes.

Next, the laminate is further thermally treated to carbonize and graphitize the fibrous substrate and the coating layer in the second thermal treatment.

The thermal treatment conditions in this step are not particularly limited as long as they are process conditions that can be adopted to conventionally carbonize and graphitize a polymer and/or a fiber.

For example, the second thermal treatment may comprise a second-first thermal treatment carried out at 700° C. to 1,800° C. for 1 hour to 20 hours; and a second-second thermal treatment carried out at 2,000° C. to 3,200° C. for 1 hour to 20 hours.

Specifically, the second thermal treatment may comprise a second-first thermal treatment carried out at 1,000° C. to 1,500° C. for 1 hour to 3 hours; and a second-second thermal treatment carried out at 2,000° C. to 3,000° C. for 5 hours to 10 hours.

The process for preparing a multilayer graphite sheet may further comprise rolling the laminate that has been subjected to the second thermal treatment. The rolling may increase the density of the multilayer graphite sheet and align the layered structure and carbon arrangement thereof to further enhance the thermal conductivity.

In addition, the rolling may adjust the thickness of the multilayer graphite sheet. In order to increase the electromagnetic shielding capability, it is preferable to roll the multilayer graphite sheet to a final thickness of 70 μm or more.

The rolling may be carried out through a roll press or the like. Specifically, the rolling may be carried out using ceramic rollers, metal rollers such as copper or stainless steel, polyurethane rollers, and rubber rollers. But it is not particularly limited as long as it is a conventional method that can be carried out to adjust the thickness of the sheet.

The pressure for the rolling may be 20 N/cm$^2$ to 80 N/cm$^2$, for example, 30 N/cm$^2$ to 50 N/cm$^2$.

Since the multilayer graphite sheet of the embodiment as described above has a multilayer structure in a total of 5 layers or more, it can be prepared to a thickness of 70 μm or more even after rolling, so that the electromagnetic shielding capability can be remarkably enhanced.

In addition, the multilayer graphite sheet can have excellent thermal conductivity by increasing its density through rolling and further strengthening the layered structure.

In particular, the multilayer graphite sheet is prepared by graphitizing a hybrid laminate in which different materials are used. Thus, it is possible to simultaneously achieve thermal conductivity and electromagnetic shielding capability at a lower cost.

Thus, the multilayer graphite sheet is useful as a thick sheet that can be used in various applications such as home appliances and electric vehicles.

MODE FOR THE INVENTION

The present invention will be described in more detail by the following examples, but it is not limited to the scope of these examples.

EXAMPLE 1

A plain weaved cotton fabric (100 m/g) made in China was used as a substrate. Both sides of the substrate were coated with a liquid resin composition (polyamic acid solids content of 18% by weight) using a roll coater. Two of the coated substrates were laminated to obtain a laminate in a total of 5 layers (coating layer/substrate layer/coating layer/substrate layer/coating layer). The laminate was imidized by drying with hot air in three steps at 150° C. for 10 minutes, 250° C. for 5 minutes, and 420° C. for 5 minutes. The imidized sheet was carbonized by thermal treatment at 1,200° C. for 2 hours and then graphitized by thermal treatment at 2,700° C. for 7 hours. The graphitized sheet was rolled at a pressure of 50 N/m$^2$ to prepare a graphite sheet having a total thickness of about 100 μm.

EXAMPLE 2

The procedures of Example 1 were repeated, except that five of the substrate coated with polyamic acid were laminated to obtain a laminate in a total of 11 layers (coating layer/substrate layer/ . . . /substrate layer/coating layer) and then subjected to imidization, carbonization, graphitization, and rolling to prepare a graphite sheet having a total thickness of 200 μm.

Comparative Example 1

Both sides of a commercially available polyimide film having a thickness of 40 μm were coated with an acrylic adhesive. Two of the film were laminated to prepare a laminate in a total of five layers (adhesive layer/film layer/adhesive layer/film layer/adhesive layer). It was subjected to the same carbonization, graphitization, and rolling as in Example 1 to prepare a graphite sheet having a total thickness of 100 μm.

Comparative Example 2

The procedures of Example 1 were repeated, except that one of the substrate coated with polyamic acid (coating layer/substrate layer/coating layer) was subjected to imidization, carbonization, graphitization, and rolling to prepare a graphite sheet having a total thickness of 40 μm.

Comparative Example 3

The procedures of Comparative Example 2 were repeated, except that the rolling pressure was adjusted to prepare a graphite sheet having a total thickness of about 25 μm.

Test Example 1: Measurement of Specific Heat

The specific heat of the graphite sheets prepared in the Examples and the Comparative Examples was measured using an LFA device (LFA 447 Model, NETZSCH).

Test Example 2: Measurement of Density

The density of the graphite sheets prepared in the Examples and the Comparative Examples was measured using an Archimedes density meter (SD-200L, Alfa Mirage).

Test Example 3: Measurement of Thermal Diffusivity

The thermal diffusivity of the graphite sheets prepared in the Examples and the Comparative Examples was measured using an LFA device (LFA 447 Model, NETZSCH).

Test Example 4: Measurement of Thermal Conductivity

The thermal conductivity of the graphite sheets prepared in the Examples and the Comparative Examples was calculated from the specific heat, density, and thermal diffusivity measured in Test Examples 1 to 3.

Test Example 5: Electromagnetic Shielding Capability

The electromagnetic shielding capability was evaluated by measuring the electromagnetic attenuation (dB) of the graphite sheets prepared in the Examples and the Comparative Examples in the range of 30 MHz to 1,500 MHz.

TABLE 1

| | Number of laminated layers | Thickness | Specific heat (J/g · K, 50° C.) | Density (g/cm$^3$) | Thermal diffusivity (mm$^2$/s) | Thermal conductivity (W/mK) | Electromagnetic shielding capability |
|---|---|---|---|---|---|---|---|
| Ex. 1 | 5 | 100 μm | 0.85 | >1.2 | >720 | 972 | >110 dB |
| Ex. 2 | 11 | 200 μm | 0.85 | >1.1 | >720 | >720 | >110 dB |
| C. Ex. 1 | 5 | 100 μm | 0.85 | 0.8 | 735 | 518 | 80-95 dB |
| C. Ex. 2 | 3 | 40 μm | 0.85 | >1.4 | >900 | 1.251 | 75-90 dB |
| C. Ex. 3 | 3 | 25 μm | 0.85 | >1.8 | >950 | 1.523 | 70-75 dB |

As shown in Table 1 above, it was confirmed that the multilayer graphite sheets of Examples 1 and 2 having a thickness of 100 μm and 200 μm had excellent thermal conductivity as compared with that of Comparative Example 1 having the same thickness. In addition, the multilayer graphite sheets of Examples 1 and 2 were remarkably superior in electromagnetic shielding capability to the graphite sheets of Comparative Examples 1 to 3.

Meanwhile, the attempt to prepare a graphite sheet having a thickness of 70 μm or more by carbonizing and graphitizing a single-layer polyimide film failed due to the characteristics of the material.

The invention claimed is:

1. A multilayer graphite sheet, which comprises a laminate in which a plurality of first graphite layers and a plurality of second graphite layers are alternately laminated in a total of five layers or more, wherein the first graphite layer is denser than the second graphite layer by 1.1 times or more, wherein the multilayer graphite sheet has an apparent density in the range of greater than 1.1 g/cm$^3$ to 1.8 g/cm$^3$,
   wherein a total thickness of the multilayer graphite sheet is 70 μm to 1,000 μm, the first graphite layer having a thickness of 10 μm to 50 μm and the second graphite layer having a thickness of 5 μm to 60 μm, wherein the total thickness is obtained by subjecting the multilayer graphite sheet to a rolling process.

2. The multilayer graphite sheet of claim 1, wherein the multilayer graphite sheet has an electromagnetic shielding capability of 110 dB or more in the range of 30 MHz to 1,500 MHz and a thermal conductivity of 700 W/m·K to 1,300 W/m·K in the a horizontal direction.

3. The multilayer graphite sheet of claim 1, wherein the first graphite layer is denser than the second graphite layer by not more than 10 times.

4. The multilayer graphite sheet of claim 1, wherein the first graphite layer is a surface layers on both sides of the multilayer graphite sheet.

5. The multilayer graphite sheet of claim 1, wherein the plurality of the first graphite layers comprises 3 to 6 layers and the plurality of the second graphite layers comprises 2 to 5 layers.

6. The multilayer graphite sheet of claim 1, wherein the first graphite layer has a thickness variation of less than 40 μm, and the second graphite layer has a thickness variation of 40 μm or more.

7. The multilayer graphite sheet of claim 1, wherein the interface between the first graphite layer and the second graphite layer has a curved shape of a wavy pattern.

8. The multilayer graphite sheet of claim 1, wherein the first graphite layer comprises a graphitized material of a cured resin, and the second graphite layer comprises a graphitized material of a fibrous substrate.

9. The multilayer graphite sheet of claim 8, wherein the cured resin comprises a cured material of a composition comprising polyamic acid.

10. The multilayer graphite sheet of claim 8, wherein the fibrous substrate is a woven, nonwoven, or paper that comprises at least one fiber selected from the group consisting of natural fibers, cellulose based fibers, and synthetic fibers,
   wherein the natural fibers comprise cotton, hemp, wool, and silk,
   wherein the cellulose based fibers comprise rayon, acetate, and triacetate, and
   wherein the synthetic fibers comprise nylon, polyester, polyurethane, polyethylene, polyvinyl chloride, polyfluoroethylene, polyvinyl alcohol, polyacrylic, and polypropylene.

11. A multilayergraphite sheet, which comprises a laminate in which a plurality of first graphite layers and a plurality of second graphite layers are alternately laminated in a total of five layers or more, wherein the first graphite layer is denser than the second graphite layer,
- wherein the first graphite layer comprises a graphitized material of a cured resin layer, and the second graphite layer comprises a graphitized material of fibers defining a fibrous substrate,
- wherein a total thickness of the multilayer graphite sheet is 70 μm to 1,000 μm, the first graphite layer has a thickness of 10 μm to 50 μm, and the second graphite layer has a thickness of 5 μm to 60 μm.

12. The multilayer graphite sheet of claim 11, wherein the multilayer graphite sheet has an electromagnetic shielding capability of 110 dB or more in the range of 30 MHz to 1,500 MHz and a thermal conductivity of 700 W/m·K to 1,300 W/·K in a horizontal direction.

13. The multilayer graphite sheet of claim 11, wherein the first graphite layer is a surface layer on both sides of the multilayer graphite sheet, and
- wherein the plurality of first graphite layers is 3 to 6 layers and the plurality of second graphite layers is 2 to 5 layers.

14. The multilayer graphite sheet of claim 11, wherein the multilayer graphite sheet is a rolled sheet subjected to a rolling process for obtaining the total thickness and comprises an apparent density in the range of greater than 1.1 g/cm$^3$ to 1.8 g/cm$^3$.

15. The multilayer graphite sheet of claim 11, wherein the cured resin layer comprises a cured material of a coating composition comprising polyamic acid.

16. The multilayer graphite sheet of claim 11, wherein the fibrous substrate is a woven, nonwoven, or paper and the fibers are selected from the group consisting of natural fibers, cellulose based fibers, and synthetic fibers,
- wherein the natural fibers comprise cotton, hemp, wool, and silk,
- wherein the cellulose based fibers comprise rayon, acetate, and triacetate, and
- wherein the synthetic fibers comprise nylon, polyester, polyurethane, polyethylene, polyvinyl chloride, polyfluoroethylene, polyvinyl alcohol, polyacrylic, and polypropylene.

17. A multilayer graphite sheet, which comprises a laminate in which a plurality of first graphite layers and a plurality of second graphite layers are alternately laminated in a total of five layers or more, wherein a total thickness of the multilayer graphite sheet is 100 μm to 1,000 μm,
- wherein the first graphite layer comprises a graphitized material of a cured resin layer, and the second graphite layer comprises a graphitized material of fibers defining a fibrous substrate, wherein the first graphite layer is denser than the second graphite layer,
- wherein the multilayer graphite sheet has an electromagnetic shielding capability of 110 dB or more in the range of 30 MHz to 1,500 MHz and a thermal conductivity of 700 W/·K to 1,300 W/m·K in a horizontal direction.

18. The multilayer graphite sheet of claim 17, wherein the first graphite layer is a surface layer on both sides of the multilayer graphite sheet, and
- wherein the plurality of first graphite layers is 3 to 6 layers and the plurality of second graphite layers is 2 to 5 layers.

19. The multilayer graphite sheet of claim 17, wherein the multilayer graphite sheet is a rolled sheet subjected to a rolling process for obtaining the total thickness and comprises an apparent density in the range of greater than 1.1 g/cm$^3$ to 1.8 g/cm$^3$.

20. The multilayer graphite sheet of claim 17, wherein the cured resin layer comprises a cured material of a coating composition comprising polyamic acid, and
- wherein the fibrous substrate is a woven, nonwoven, or paper and the fibers are selected from the group consisting of natural fibers, cellulose based fibers, and synthetic fibers,
- wherein the natural fibers comprise cotton, hemp, wool, and silk,
- wherein the cellulose based fibers comprise rayon, acetate, and triacetate, and
- wherein the synthetic fibers comprise nylon, polyester, polyurethane, polyethylene, polyvinyl chloride, polyfluoroethylene, polyvinyl alcohol, polyacrylic, and polypropylene.

* * * * *